United States Patent [19]

Kruehler et al.

[11] Patent Number: 4,879,251

[45] Date of Patent: Nov. 7, 1989

[54] METHOD OF MAKING SERIES-CONNECTED, THIN-FILM SOLAR MODULE FORMED OF CRYSTALLINE SILICON

[75] Inventors: Wolfgang Kruehler, Unterhaching; Peter Milla, Munich, both of Fed. Rep. of Germany

[73] Assignee: Siemens Aktiengesellschaft, Berlin and Munich, Fed. Rep. of Germany

[21] Appl. No.: 222,505

[22] Filed: Jul. 21, 1988

[30] Foreign Application Priority Data

Aug. 20, 1987 [DE] Fed. Rep. of Germany ....... 3727826

[51] Int. Cl.$^4$ ..................... H01L 31/18; H01L 27/14
[52] U.S. Cl. ........................................... 437/4; 437/2; 136/244; 136/258
[58] Field of Search ........ 437/2, 4; 136/244, 249 MS, 136/258 PC

[56] References Cited

U.S. PATENT DOCUMENTS

| 3,151,379 | 10/1964 | Escoffery ................................ 437/4 |
| 3,483,038 | 12/1969 | Hui et al. ............................. 136/244 |
| 4,243,432 | 1/1981 | Jordan et al. ......................... 136/244 |
| 4,245,386 | 1/1981 | Kausche et al. ......................... 437/2 |
| 4,283,589 | 8/1981 | Kaplow et al. .............. 136/249 MS |
| 4,758,526 | 7/1988 | Thaleheimer ........................... 437/2 |

FOREIGN PATENT DOCUMENTS

| 0232749 | 1/1986 | European Pat. Off. ............ 136/244 |
| 2577716 | 2/1986 | France ................................ 136/244 |

OTHER PUBLICATIONS

"Block V Module Development and Test Results", M I. Smokler, Jet Propulsion Laboratories California Institute of Technology, pp. 370-376, Proceedings 6th E.C. Photovoltaic Solar Energy Conf. (1985).

"A Monolithic Series Array Solar Battery", R. M. Warner, Jr. et al., Dept. of Electrical Engineering, University of Minnesota, pp. 1116, 1117, 13th IEEE Photovoltaic Specialists Conference (1978) Jun. 5.

Japanese Pat. Off. Gazette, vol. 9, No. 216, Sep. 3, 1985, Photo Electric Generator 60-77471.

"The Production of Silicon Layers on Graphite for Photovoltaic Use", D. J. Harris et al., pp. 1486-1487, 19 *IEEE Photovoltaic Specialist Conference* (1987) New Orleans, La., May 4-8, 1987.

Primary Examiner—Aaron Weisstuch
Attorney, Agent, or Firm—Hill, Van Santen, Steadman & Simpson

[57] ABSTRACT

Method for manufacturing a series-connected thin-film solar module of crystalline silicon upon which is formed an electrically conductive layer upon which is formed a p-doped polycrystalline silicon layer which is about 50 microns thick both being deposited on a large area of glass or ceramic substrate and a pn junction is formed in the p-doped polycrystalline silicon layer. Individual cells that have a width between one to two centimeters are formed by forming trenches so as to electrically insulate them from each other in the silicon layer and the trenches are filled with an insulator material. Front electrodes and electrodes for series interconnecting the individual cells are formed over the cells and into holes formed for that purpose and the method saves up to 80% of silicon material as compared to prior art methods.

11 Claims, 2 Drawing Sheets

METHOD OF MAKING SERIES-CONNECTED, THIN-FILM SOLAR MODULE FORMED OF CRYSTALLINE SILICON

BACKGROUND OF THE INVENTION

1. Field of the Invention

This invention relates in general to a method for manufacturing a series-connected thin-film solar cell module made of crystalline silicon.

2. Description of the Prior Art

So as to exploit regenerable energy sources, specifically solar energy, it is necessary to develop efficient solar cells and solar modules which are inexpensive and efficient. Solar cells are already available in low power applications for example, for driving electronic clocks or pocket calculators, but the efficient generation of power by solar energy in general power applications has not been satisfactorily accomplished because of high cost of materials and manufacturing costs.

It is thus necessary to develop highly efficient large area stable low cost solar cells or modules for photovoltic energy generating for substantial amounts of power. Solar cells of crystalline silicon are preferred because of their high efficiency in energy conversion.

Current solar modules of crystalline silicon are disclosed, for example, in a report by M. I. Smokler in the *Proceedings of the Sixth European Solar Energy Conference,* London, 1985, pages 370 through 376 which describes individual solar cells of about 0.4 mm through 0.5 mm thickness that each have an area of about 10 cm×10 cm. The separately produced individual cells must first be joined together to form larger solar modules and must be soldered to each other using metallic bands in a complicated manner for electrical interconnection. Series and/or parallel connection of the individual cells are possible.

A significant increase in the size of the crystalline individual cells is not possible because excessively high photocurrents occur under illumination as, for example, AM1 light which is a light that has a spectrum and intensity that corresponds to solar radiation at the terrestrial equator at sea level when the sun is in the overhead position and such high currents cannot be removed by the finger-shaped contacts in a satisfactory manner. Adhesion problems arise with regard to the contacts on the silicon which reduce the performance of the cell, particularly when large temperature differences occur in the day/night cycle which goes from hot to cold. By contrast, reinforcing the contact leads causes additional light shadowing and, thus, also results in losses in performance.

So as to manipulate the individual silicon substrates, they are far thicker about 0.4 mm so as to obtain mechanical stability, which thickness is far greater than would be required to obtain complete light absorption. For example, a crystalline silicon layer already absorbs 90% of the light of AM 1.5 illumination when the layer thickness is 100 $\mu$m. The known crystalline silicon solar modules thus have previously been limited to use for small and thick silicon layers.

SUMMARY OF THE INVENTION

It is an object of the present invention to provide a method of manufacturing efficient solar modules of crystalline silicon wherein large area substrates can be utilized and the cost for silicon material is reduced and the electrical interconnections are integrated into the manufacturing process.

In the method of the invention, this object is achieved by (a) using an electrically conductive layer which is first applied surface-wide to a large area substrate which is preferably formed of glass or ceramic; (b) a polycrystalline p-doped silicon layer is applied to the substrate which has a grain size from 200–500 $\mu$m; (c) a shallow pn-junction is formed in the silicon layer by introducing n-dopant atoms or, respectively, ions; (d) the electrically conductive layer and the silicon layer are formed into strip-shaped areas by forming trenches that extend down into the surface of the substrate which are spaced about 1–2 cm apart; (e) the trenches are filled with an electrically insulating material; (f) so as to obtain series connection of the individual cells, holes are formed at a depth in the silicon layer until the electrically conductive layer forming the back electrode is exposed and (g) a metallic grid structure is applied onto the surface of the silicon layer using a silk screening process and it is applied in a manner such that the grid structure forms the front electrodes and also produces an electrical contact to the back electrode of the neighboring strip cells which are exposed through the holes which have been formed.

The solar module according to the invention results in up to 80% of the cost of silicon material as compared to prior art crystalline silicon solar modules. The entire manufacturing process is integrated into one process. Both the assembly of the individual cells as well as the required soldering of the prior art devices are eliminated. The use of large area substrates also simplifies the process and increases the output of the units.

Other objects, features and advantages will be readily apparent from the following description of certain preferred embodiments thereof taken in conjunction with the accompanying drawings, although variations and modifications may be effected without departing from the spirit and scope of the novel concepts

DESCRIPTION OF THE PREFERRED EMBODIMENTS

Figure 1:
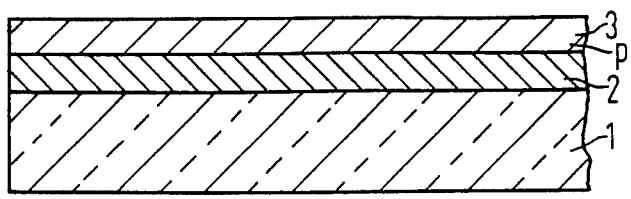
FIG. 1 is a plan view illustrating the first step in the method of producing the solar module of the invention.

FIG. 1 is a plan view illustrating the formation of the solar module which is formed on a large area substrate 1 which may have a length along one edge for example, of one meter which is formed of an economically electrically insulating material such as glass or ceramic for example. During a first step, an electrically conductive layer 2 is formed of reflecting metal, for example, by vapor depositing silver, or from graphite or from a transparent conductive oxide TCO, for example, doped tin oxide. When a glass substrate is used in combination with a TCO layer, then a reflective metal layer is also formed on the backside of the substrate which would be on the opposite side to the side upon which the conductive layer 2 is formed. This is not illustrated in FIG. 1. An active silicon layer 3 is formed over the reflective layer 2 and incident light rays are reflected at the mirror surface in the finished module and reflected back through the active silicon layer 3 a second time. As a result, the length of the path of the light in the silicon layer 3 which is effective for absorption of the radiation can be doubled and, respectively, the thickness of the silicon layer can be reduced by 50%. The active layer may have a thickness of 20 to 100 $\mu$m which is adequate for proper operation. There are a number of methods for forming the polycrystalline silicon layer 3 which has a thickness that might preferably be 50 $\mu$m such as CVD process, sputtering, vapor deposition, epitaxial growth, powder and other crystallization methods (rapid annealing) or a combination of these methods. In any case, the quality of the method should be sufficient so as to generate a grain size in the silicon layer 3 of at least 200 $\mu$m; or even better 500 $\mu$m. An efficiency of about 10% can be achieved in the solar module. The silicon layer 3 is p-doped so as to obtain better mobility of the minority charge carrier electrons and the diffusion length is about twice the layer thickness or about 100 $\mu$m.

Figure 2:
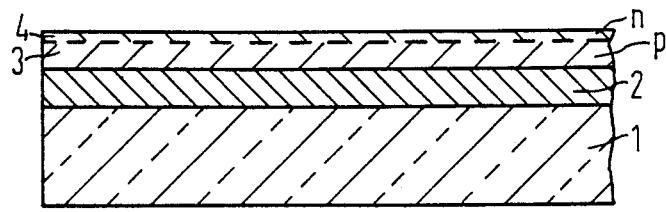
FIG. 2 is a plan view illustrating a second step in the method of the invention.

FIG. 2 illustrates the formation of a pn-junction 4 in the p-doped layer 3 which is formed by introducing n-dopants such as, for example, phosphorous into the layer 3. This can occur using ion implantation or by driving in phosphorous from phosphorous containing layers that are superficially applied onto the layer 3 (not shown in the FIG.).

Figure 3:
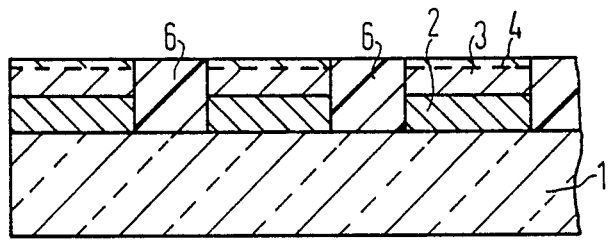
FIG. 3 is a plan view illustrating a third step in the method of the invention.

As shown in FIG. 3, trenches or grooves having widths of about 0.5 mm are formed into the surface through the layers 3 and 2 to the surface of the substrate 1 and such trenches or grooves are spaced about 1 to 2 cm apart and are formed by laser scribing, milling or etching the silicon layer 3 and the layer 2. The result is that strip-shaped individual solar cells that are electrically insulated from each other re formed which have individual electrodes 2 plus individual active silicon layers 3 and these are formed so as to have surface areas of about 100 cm$^2$ each. Thus, when the trenches have spacings of 1 cm, then the length or, respectively, the width of the substrate 1 can be up to one meter.

Plastic in paste form that can be easily introduced as, for example, by painting and subsequently polishing of the surface and that can be hardened during an after treatment, as for example, heating are suitable for filling of the trenches with insulating material 6. It is also possible to use photoresist etching masks in the proceeding step so as to deposit an insulating layer over the surface and in turn to lift it off at the locations covered by the photoresist using a lift off process.

Figure 4:
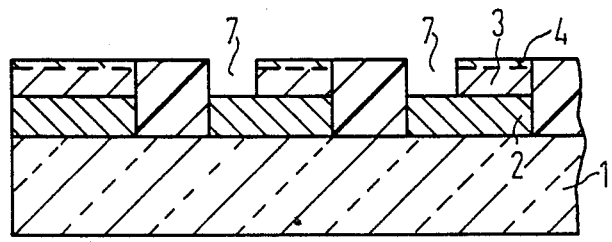
FIG. 4 is a plan view illustrating a four-step in the method of the invention.

As shown in FIG. 4, holes 7 are milled or etched directly next to the trenches filled with the insulator 6, preferably at the end of the strip cells thus formed.

Figure 5:
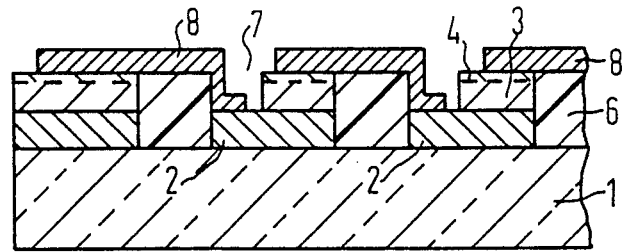
FIG. 5 is a plan view illustrating a fifth step in the method of the invention.
Figure 6:
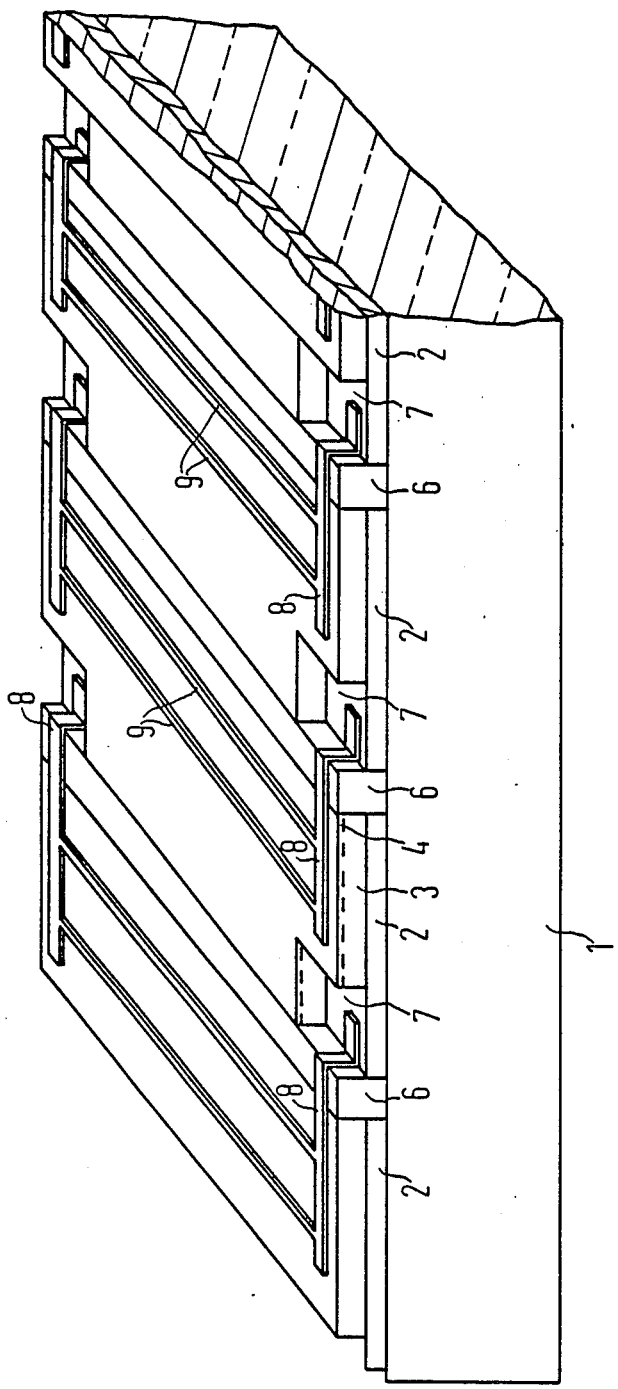
FIG. 6 is a perspective view of the finished solar module of the invention.

As shown in FIG. 5, using a silk screening process with a paste, a metallic grid structure 8, 9 is then applied to the surface of the module and this forms the front electrodes 9 shown in FIG. 6 as well as the series interconnection electrodes 8 for the individual cells. FIG. 5 shows the short metallic strips 8 which extend perpendicular to the trenches filled with insulator material 6 which lie on the surface of the active silicon layer 3 and which cross over the insulating strips 6 and contact the back electrodes 2 of the respective neighboring strip cell which are exposed by way of the holes 7.

FIG. 6 is a perspective view showing the finished solar module. Strips 9 of the metallic grid structure 8 and 9 extend parallel to the insulating trenches 6 and the front electrodes 9 remove the photocurrent from the surface of the solar cells. At least one, but preferably two metal strips 9 are provided for each of the strip cells.

The number of series-connected strip cells in the solar module determine the overall voltage of the module that can be obtained and this can be varied for each particular application.

The solar module is then electrically connected in a known manner and is provided with protection from weather by integrating it into a suitable frame, not shown in the FIGS. The solar module can be utilized as an independent module or it can be nested and connected with other modules or together with submodules of other materials as, for example, amorphous silicon can serve as a submodule in a tandem cell.

This allows additional increases in efficiency.

Although the invention has been described with respect to preferred embodiments, it is not to be so limited as changes and modifications can be made which are within the full intended scope of the invention as defined by the appended claims.

We claim as our invention:

1. A method for manufacturing a series-connected, thin-film solar cell module of crystalline silicon comprising the steps of:
   (a) applying an electrically conductive layer (2) over the surface of a large-area substrate (1) of glass or ceramic;
   (b) applying a polycrystalline, p-doped silicon layer (3) to the surface of said conductive layer (2) which has a grain size of 200 through 500 micrometers;
   (c) forming a pn-junction (4) in said silicon layer (3) by introducing n-dopant atoms or, respectively, ions;
   (d) forming trenchs in said electrically conductive layer (2) and said silicon layer (3) to produce strips where the trenches extend down onto the surface of the substrate (1) with a spacing of about 1 to 2 cm;
   (e) filling said trenches with an electrically insulating material (6);
   (f) forming holes (7) for the series-interconnection of the individual cells, which are formed to a depth in the silicon layer (3) until the electrically conductive layer (2) which forms the back electrode (2) is exposed; and
   (g) applying a metallic grid structure (8, 9) to the surface of said silicon layer (3) with a silk screening method, such that the grid structure (8, 9) forms a front electrode (9) and also forms an electrical contact (8) to the back electrode (2) of the respectively neighboring strip cell that lies exposed through holes (7).

2. A method according to claim 1, wherein said electrically conductive layer (2) is formed of reflecting metal, graphite or transparent, conductive oxide (TCO).

3. A method according to claim 2 wherein the conductive oxide is doped tin oxide.

4. A method according to claims 1 or 2, wherein the material of said substrate (1) is glass and said electrically conductive layer (2) is transparent, conductive oxide, and comprising the further step of applying a reflective metal layer to the underside of said substrate (1).

5. A method according to claims 1 or 2 wherein the thickness of said silicon layer (3) is in the range from 100 μm, to 20 μm.

6. A method according to claims 1 or 2 wherein said pn-junction (4) is produced by phosphorous ion implantation or by drive-in of phosphorous into said silicon layer (3).

7. A method according to claims 1 or 2 wherein said trenches have widths of about 0.5 mm and are produced by laser scribing, milling or selective etching using a photoresist technique.

8. A method according to claims 1 or 2 wherein said trenches are filled with a plastic paste (6); and said plastic paste is subsequently hardened.

9. A method according to claims 1 or 2 wherein said trenches are selectively filled using an etching mask, and are selectively filled by depositing insulating material (6) therein.

10. A method according to claims 1 or 2 wherein said metallic grid structure (8, 9) for a strip cell is formed of at least one metal strip (9) which extends the entire length of the strip cell and parallel to said trenches and of at least one, shorter metal strip (8) which extends perpendicularly thereto, and where said shorter metal strip (8) electrically connects the longer metal strip (9) of a strip cell to the back electrode (2) of the neighboring strip cell by way of said hole (7), and said back electrode (2) is separated by said trench which is filled with insulating material (6).

11. A method according to claim 1 or 2 wherein said silicon layer (3) is produced by a CVD method, by sputtering, by vapor-deposition, by epitaxial growth, by powder or other recrystallization methods or by a combination of these methods.

* * * * *